US012762302B2

(12) United States Patent
Vedula et al.

(10) Patent No.: US 12,762,302 B2
(45) Date of Patent: Oct. 13, 2026

(54) LINE DIAGRAM CONVERSION PLATFORM AND METHODS FOR USE THEREWITH

(71) Applicant: Alectify Inc., Richmond Hill (CA)

(72) Inventors: Naveen Vedula, Vancouver (CA); Ajay Gupta, Richmond Hill (CA)

(73) Assignee: Alectify Inc., Richmond Hill (CA)

( * ) Notice: Subject to any disclaimer, the term of this patent is extended or adjusted under 35 U.S.C. 154(b) by 1024 days.

(21) Appl. No.: 18/049,321

(22) Filed: Oct. 25, 2022

(65) Prior Publication Data

US 2023/0127812 A1 Apr. 27, 2023

Related U.S. Application Data

(60) Provisional application No. 63/263,109, filed on Oct. 27, 2021.

(51) Int. Cl.
*G06F 30/12* (2020.01)
*G06F 30/18* (2020.01)

(52) U.S. Cl.
CPC .............. *G06F 30/18* (2020.01); *G06F 30/12* (2020.01)

(58) Field of Classification Search
CPC .......... G06F 30/13; G06F 30/27; G06F 30/12; G06F 2113/16; G06F 30/20; G06F 40/30;
(Continued)

(56) References Cited

U.S. PATENT DOCUMENTS

2019/0371102 A1 12/2019 Prostko et al.
2020/0167557 A1 5/2020 Rahul et al.
(Continued)

OTHER PUBLICATIONS

Elyan et al., "Deep learning for symbols detection and classification in engineering drawings" (Sep. 2020), Neural Networks vol. 129, pp. 91-102 [retrieved from https://www.sciencedirect.com/science/article/pii/S0893608020301957?ref=pdf_download&fr=RR-2&rr=9dec3cbb49b5c9a1]. (Year: 2020).*
(Continued)

*Primary Examiner* — Brian W Wathen
(74) *Attorney, Agent, or Firm* — Katz Ruby & Carle LLP; Bruce E. Stuckman

(57) ABSTRACT

A line diagram conversion platform operates to: facilitate generation of a graphical user interface to interact with a user of a client device; import, via a network interface, single line diagram image data associated with an electrical wiring diagram; generate, via an artificial intelligence equipment detection function and based on the single line diagram image data, equipment type and location data associated with one or more pieces of equipment detected in the single line diagram image data; generate equipment tag text and location data associated with one or more equipment tags detected in the single line diagram image data; generate, based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data; and send, via the network interface, the interactive single line diagram display data to the client device for display and interaction via the graphical user interface.

18 Claims, 14 Drawing Sheets

(58) Field of Classification Search
CPC G06F 40/117; G06F 2111/20; G06F 2111/12; G06F 2111/04; G06Q 10/06313; G06Q 10/103; G06N 20/00; G06V 20/70; G06V 10/44
See application file for complete search history.

(56) References Cited

U.S. PATENT DOCUMENTS

| | | | | |
|---|---|---|---|---|
| 2020/0387553 | A1* | 12/2020 | Tyulyaev | G06V 10/764 |
| 2021/0103686 | A1* | 4/2021 | Frey | G06T 15/205 |
| 2021/0150081 | A1* | 5/2021 | Auh | G05B 19/4183 |
| 2021/0174077 | A1* | 6/2021 | Sowell | G06N 3/08 |
| 2021/0256180 | A1* | 8/2021 | Austern | G06F 30/12 |
| 2022/0043547 | A1* | 2/2022 | Jahjah | G06F 3/0484 |
| 2022/0156418 | A1* | 5/2022 | Xu | G06F 30/13 |
| 2022/0391627 | A1* | 12/2022 | Powles | G06Q 10/103 |

OTHER PUBLICATIONS

International Searching Authority; International Search Report and Written Opinion; Application No. PCT/US2022/078678; Feb. 28, 2023; 10 pgs.

* cited by examiner

150

1700

LINE DIAGRAM CONVERSION PLATFORM AND METHODS FOR USE THEREWITH

CROSS-REFERENCE TO RELATED APPLICATIONS

The present U.S. Utility Patent Application claims priority pursuant to 35 U.S.C. § 119(e) to U.S. Provisional Application No. 63/263,109, entitled "LINE DIAGRAM CONVERSION PLATFORM AND METHODS FOR USE THEREWITH", filed Oct. 27, 2021, which is hereby incorporated herein by reference in its entirety and made part of the present U.S. Utility Patent Application for all purposes.

TECHNICAL FIELD

The present disclosure relates to processing systems and applications used in the processing and display of electrical wiring diagrams.

DETAILED DESCRIPTION

Figure 1:
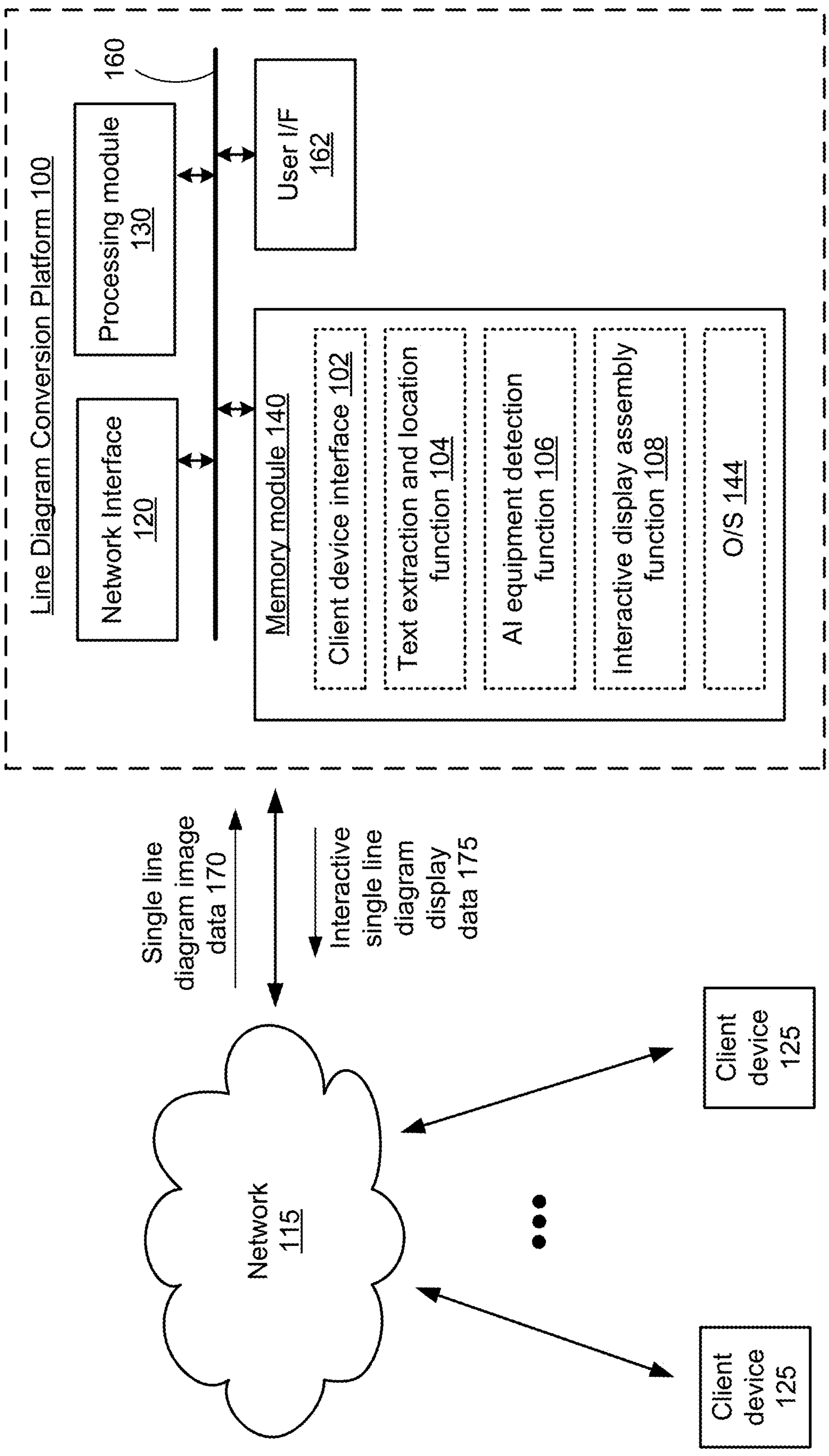
FIG. 1 presents a block diagram representation of an example system.

FIG. 1 presents a block diagram representation of an example system. In particular, a system 150 is presented that includes a line diagram conversion platform 100 that communicates with client devices 125 via a network 115. The network 115 can be the Internet or other wide area or local area network, either public or private. The client devices 125 can be computing devices associated with users/subscribers associated with the line diagram conversion platform 100.

In the example shown, the line diagram conversion platform 100 includes a client device interface 102 for interacting with the client devices 125, text extraction and location functions 104, AI equipment detection functions 106, interactive display assembly function 108 and an operating system 144.

The line diagram conversion platform 100 includes a network interface 120 such as a 3G, 4G, 5G or another cellular wireless transceiver, a Bluetooth transceiver, a WiFi transceiver, UltraWideBand transceiver, WIMAX transceiver, ZigBee transceiver or other wireless interface, a Universal Serial Bus (USB) interface, an IEEE 1394 Firewire interface, an Ethernet interface or other wired interface and/or other network card or modem for communicating for communicating via the network 115.

The line diagram conversion platform 100 also includes a processing module 130 and memory module 140 that stores the operating system (O/S) 144 such as an Apple, Unix, Linux or Microsoft operating system or another operating system, client device interface 102, text extraction and location functions 104, AI equipment detection functions 106, and the interactive display assembly function 108. The O/S 144, client device interface 102, text extraction and location functions 104, AI equipment detection functions 106, and the interactive display assembly function 108 each include operational instructions that, when executed by the processing module 130, cooperate to configure the processing module 130 into a special purpose device to perform the particular functions of the line diagram conversion platform 100 described herein.

The line diagram conversion platform 100 may include a user interface (I/F) 162 such as a display device, touch screen, key pad, touch pad, joy stick, thumb wheel, a mouse, one or more buttons, a speaker, a microphone, an accelerometer, gyroscope or other motion or position sensor, video camera or other interface devices that provide information to an administrator of the line diagram conversion platform 100 and that generate data in response to the administrator's interaction with line diagram conversion platform 100.

The processing module 130 can be implemented via a single processing device or a plurality of processing devices. Such processing devices can include a microprocessor, micro-controller, digital signal processor, microcomputer, central processing unit, quantum computing device, field programmable gate array, programmable logic device, state machine, logic circuitry, analog circuitry, digital circuitry, and/or any device that manipulates signals (analog and/or digital) based on operational instructions that are stored in a memory, such as memory 140. The memory module 140 can include a hard disc drive or other disc drive, read-only memory, random access memory, volatile memory, non-volatile memory, static memory, dynamic memory, flash memory, cache memory, and/or any device that stores digital information. Note that when the processing device implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. While a particular bus architecture is presented that includes a single bus 160, other architectures are possible including additional data buses and/or direct connectivity between one or more elements. Further, the line diagram conversion platform 100 can include one or more additional elements that are not specifically shown. It should be noted that the line diagram conversion platform 100 can be implemented as a single integrated system that is located centrally, can be implemented on a distributed basis with one or more components located remotely and connected via a network and/or implemented via a cloud computing system.

For example, the client device interface 102 can operate in conjunction with each client device 125 and via network 115 to generate a graphical user interface (GUI). This graphical user interface is based on display data generated by the line diagram conversion platform 100 in a format for display on a display device associated with the client devices 125. This graphical user interface generates input data that is received by the line diagram conversion platform 100 from the client devices 125 in response to user interaction with the graphical user interface.

In operation, the line diagram conversion platform 100 can operate to receive single line diagram image data 170 associated with an electrical wiring diagram and to generate interactive single line diagram display data 175 that is sent to a client device 125 for display and interaction via a graphical user interface. The single line diagram image data 170 can represent electrical diagram/layouts such as static electrical diagrams and/or other wiring/electrical equipment diagrams or layouts in any of a plurality of image formats such as PDF, AutoCAD, Micro Station and/or other image or drawing formats. A list of equipment tags may or may not be provided along with these diagrams.

The interactive single line diagram display data 175 can be formatted to produce a live web application/dashboard or other GUI where equipment tags are replaced by interactive buttons that are located at the same location where the tags were present input images. In addition, in the equipment present in the image input can be located and detected in the input images, classified by equipment type and presented as part of the interactive display.

In various examples, the operations of line diagram conversion platform 100 include:

- importing, via the network interface 120, single line diagram image data 170 associated with an electrical wiring diagram;
- generating, via a processor of processing module 130 and based on the single line diagram image data, equipment tag text and location data associated with one or more equipment tags detected in the single line diagram image data;
- generating, via an artificial intelligence equipment detection function and based on the single line diagram image data, equipment type and location data associated with one or more pieces of equipment detected in the single line diagram image data;
- generating, via the processor and based on the equipment tag text and location data and the equipment type and location data, interactive single line diagram display data 175 having one or more interactive equipment tags associated with the one or more equipment tags detected in the single line diagram image data and further having visual equipment indications associated with the one or more pieces of equipment detected in the single line diagram image data; and
- sending, via the network interface 120, the interactive single line diagram display data 175 to the client device 125 for display and interaction via the graphical user interface.

As will be apparent to one skilled in the art, the line diagram conversion platform 100 improves the technology of line diagram display systems by converting static diagrams into interactive displays that provide many other types of data and information in conjunction with the diagram itself. Furthermore, the graphical user interface facilitated by this platform greatly improves the technology of such computer systems via an improved user experience—making such other types of data quickly, easily, and efficiently accessible to users of such systems in conjunction with the display of the line diagram. Further details, several optional functions, features and implementations, are presented in conjunction with FIGS. 2-17 that follow.

Consider the further example where a line diagram conversion (LDC) platform 100 includes a network interface 120 configured to communicate via a network and a processing system that includes a memory, such as memory module 140, that stores operational instructions and at least one processor, such as processing module 130, configured to execute the operational instructions, wherein the operational instructions cause the at least one processor to:

- generate a graphical user interface to interact with a user of a client device;
- import, via the network interface, single line diagram image data associated with an electrical wiring diagram;
- generate, based on the single line diagram image data, equipment tag text and location data associated with one or more equipment tags detected in the single line diagram image data;
- generate, via an artificial intelligence (AI) equipment detection function and based on the single line diagram image data, equipment type and location data associated with one or more pieces of equipment detected in the single line diagram image data;
- generate, based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data; and
- send, via the network interface, the interactive single line diagram display data to the client device for display and interaction via the graphical user interface.

In addition or in alternative to any of the foregoing, the artificial intelligence equipment detection function is implemented via a computer vision model.

In addition or in alternative to any of the foregoing, the computer vision model is trained based on a training dataset of electrical symbol images.

In addition or in alternative to any of the foregoing, the computer vision model is retrained in response to at least one of: when new electrical symbols images are added to the training dataset; or when errors are found in the AI equipment detection function.

In addition or in alternative to any of the foregoing, the equipment tag text and location data indicates the text of the one or more equipment tags and location information indicating a position of each of the one or more equipment tags in the diagram.

In addition or in alternative to any of the foregoing, the equipment tag text and location data is generated via a text extraction and location function that operates via text recognition.

In addition or in alternative to any of the foregoing, the equipment tag text and location data is generated further based on an equipment tag list.

In addition or in alternative to any of the foregoing, the text extraction and location function operates in the absence of an equipment tag list to: generate recognized text; generated filtered text by filtering the recognized text based on a proximity of recognized text to locations of equipment determined by the equipment type and location data; and determine, based on the filtered text, the equipment tag text associated with each of the one or more equipment tags.

In addition or in alternative to any of the foregoing, the one or more interactive equipment tags includes links corresponding to the one or more equipment tags.

In addition or in alternative to any of the foregoing, the graphical user interface is a web-based graphical user interface.

In addition or in alternative to any of the foregoing, the one or more interactive equipment tags includes an interactive button presented in conjunction with the graphical user interface and associated with a corresponding one of the one or more equipment tags.

In addition or in alternative to any of the foregoing, the interactive single line diagram display data includes the electrical wiring diagram and wherein the interactive button is overlaid on the electrical wiring diagram in a location of the corresponding one of the one or more equipment tags.

In addition or in alternative to any of the foregoing, in response to user interaction with the interactive button, the graphical user interface presents equipment information pertaining to the corresponding one of the one or more equipment tags.

In addition or in alternative to any of the foregoing, the equipment information pertaining to the corresponding one of the one or more equipment tags includes one or more of: a site location, information on other single line drawings where the equipment is present; approval drawings; manuals; an image of corresponding equipment; an open box equipment image before shipment of the corresponding equipment; a closed box equipment image before shipment of the corresponding equipment; an equipment image of the corresponding equipment after being received; or project details related to the corresponding equipment.

In addition or in alternative to any of the foregoing, the equipment information pertaining to the corresponding one of the one or more equipment tags includes a review of progress related to corresponding equipment.

In addition or in alternative to any of the foregoing, memory stores project data that includes at least one of: a chat history; project details or the equipment information; and wherein the at least one processor performs analytics on the project data.

In addition or in alternative to any of the foregoing, the analytics include one or more of: a project schedule; a flag of potential an out of schedule delay; an adjustment of the project schedule; an estimated completion date; or project flow data.

Figure 2:
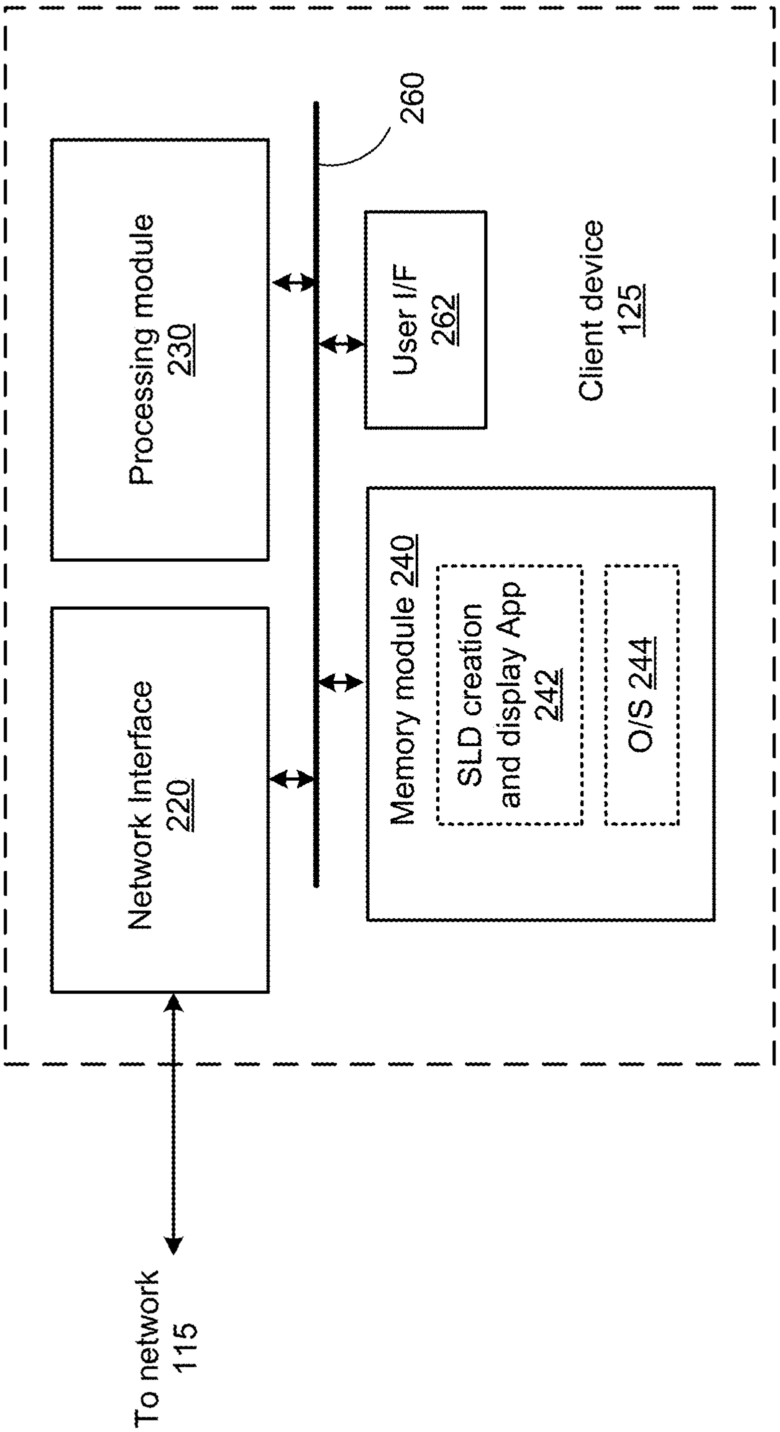
FIG. 2 presents a block diagram representation of an example client device.

FIG. 2 presents a block diagram representation of an example client device. In particular, a client device 125 is presented that operates in conjunction with the line drawing conversion platform 100.

In particular, a client device 125 is presented that includes a network interface 220 such as a 3G, 4G, 5G or another cellular wireless transceiver, a Bluetooth transceiver, a WiFi transceiver, UltraWideBand transceiver, WIMAX transceiver, ZigBee transceiver or other wireless interface, a Universal Serial Bus (USB) interface, an IEEE 1394 Firewire interface, an Ethernet interface or other wired interface and/or other network card or modem for communicating for communicating via network 115.

In various examples, the client device 125 also includes a processing module 230 and memory module 240 that stores an operating system (O/S) 244 such as an Apple, Unix, Linux or Microsoft operating system or other operating system, and a single line drawing (SLD) creation and display app 242. The O/S 244 and the SLD creation and display app 242 each include operational instructions that, when executed by the processing module 230, cooperate to configure the processing module 230 into a special purpose device to perform the particular functions of the client device 125 described herein.

The client device 125 also includes a user interface (I/F) 262 such as a display device, touch screen, key pad, touch pad, joy stick, thumb wheel, a mouse, one or more buttons, a speaker, a microphone, an accelerometer, gyroscope or other motion or position sensor, video camera or other interface devices that provide information to a user of the client device 125 and that generate data in response to the user's interaction with the client device 125.

The processing module 230 can be implemented via a single processing device or a plurality of processing devices. Such processing devices can include a microprocessor, micro-controller, digital signal processor, microcomputer, central processing unit, quantum computing device, field programmable gate array, programmable logic device, state machine, logic circuitry, analog circuitry, digital circuitry, and/or any device that manipulates signals (analog and/or digital) based on operational instructions that are stored in a memory, such as memory 240. The memory module 240 can include a hard disc drive or other disc drive, read-only memory, random access memory, volatile memory, non-volatile memory, static memory, dynamic memory, flash memory, cache memory, and/or any device that stores digital information. Note that when the processing device implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. While a particular bus architecture is presented that includes a single bus 260, other architectures are possible including additional data buses and/or direct connectivity between one or more elements. Further, the client device 125 can include one or more additional elements that are not specifically shown.

The client device 125 operates, via network interface 220, network 115 and the line drawing conversion platform 100. In various examples, the client device 125 operates to display a graphical user interface generated based on display data from the line drawing conversion platform 100, including corresponding screen displays. Furthermore, the graphical user interface can operate in response to interactions by a user to generate input data that is sent to the line drawing conversion platform 100 to control the operation of the line drawing conversion platform 100 and/or to provide other input.

In various examples, the single line drawing creation and display app 242 operates to import, via the network interface 220, single line diagram image data 170 associated with an electrical wiring diagram to the line drawing conversion platform 100. In addition, the client device 125 operates to receive, via the network interface 220, the interactive single line diagram display data 175 from the line drawing conversion platform 100 for display and interaction via the graphical user interface via user interface 262.

Figure 3:
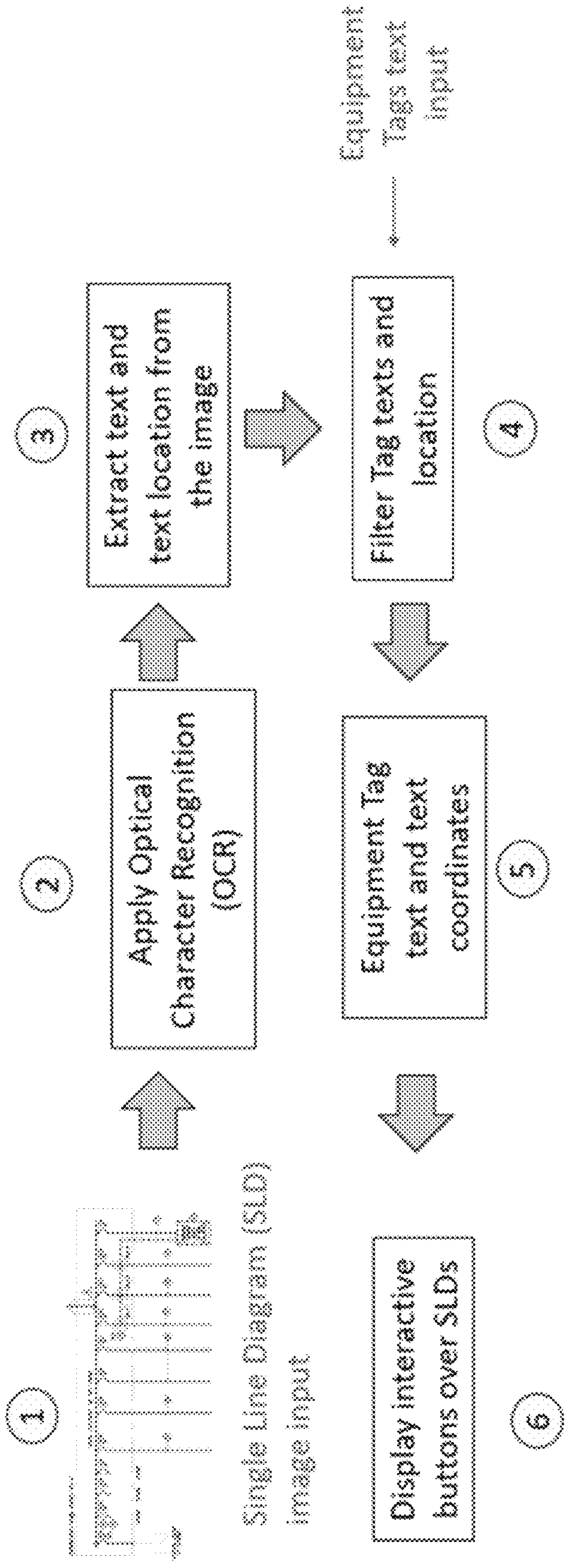
FIG. 3 presents a flow diagram representation of an example process for generating interactive single line diagram image data.

FIG. 3 presents a flow diagram representation of an example process for generating interactive single line diagram image data. In the example shown, optical character recognition (OCR) is applied (#2) to SLD image input (#1) and used to extract text and text location from the image (#3). The extracted tag texts and locations are filtered (#4) based on equipment tag texts corresponding to the input. The resulting equipment tag texts and text coordinates (#5) are used to generate an interactive display having interactive buttons over the SLD (#6) corresponding to the equipment tags in the SLD.

Figure 4:
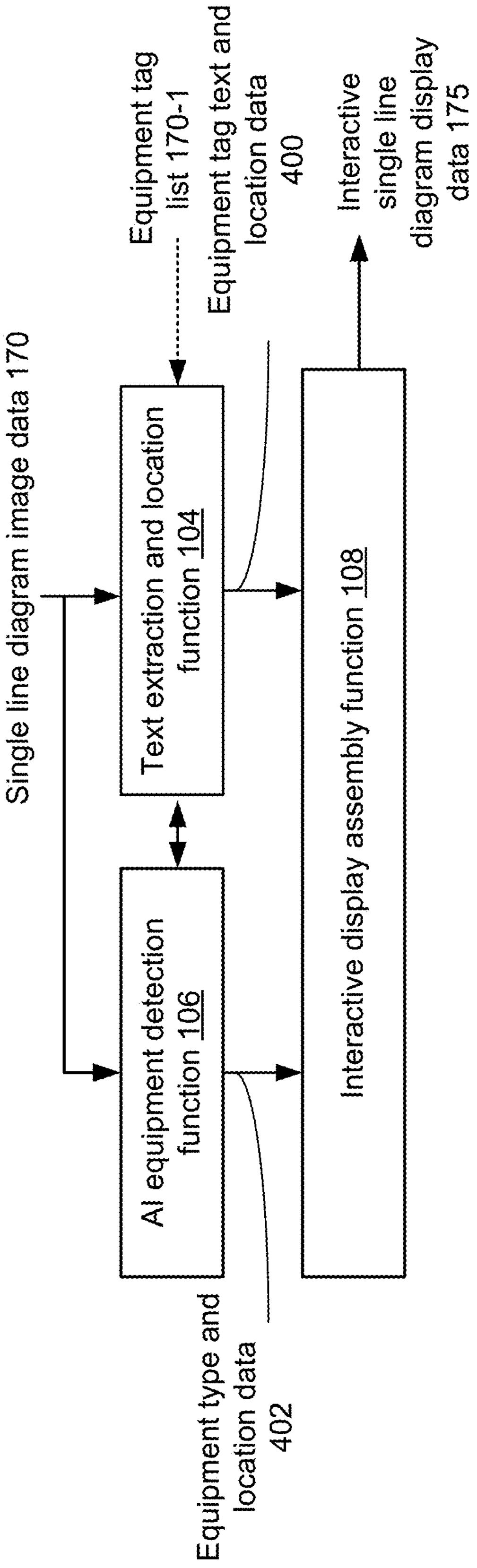
FIG. 4 presents a block/flow diagram representation of an example process for generating interactive single line diagram image data.

FIG. 4 presents a block/flow diagram representation of an example process for generating interactive single line diagram image data. In the example shown, the AI equipment detection function 106 operates to generate, based on the single line diagram image data 170, equipment type and location data 106 associated with one or more pieces of equipment detected in the single line diagram image data. For example, the AI equipment detection function 106 can be implemented via an AI object detection model such as a Yolo—v3 model, other computer vision model or other machine learning that is trained based on a training dataset of electrical symbol images.

In the example shown, the text extraction and location function 104 receives single line diagram image data 170 associated with an electrical wiring diagram and generates equipment tag text and location data 400 associated with one or more equipment tags detected in the single line diagram image data. In particular, the equipment tag text and location data 400 indicates the text of one or more equipment tags along with the corresponding coordinates or other location information indicating the position of each tag in the diagram.

In various examples, the text extraction and location function 104 operates via an optical character recognition (OCR) function or other text recognition technique. As shown, the extraction and location function 104 can operate further based on an equipment tag list that accompanies or is included within the electrical single line diagram image data 170. This information can be used to filter the recognized text based on the equipment tags to the determine the location of the particular text corresponding to the text of the equipment tags. In the absence of an equipment tag list, e.g., when the text extraction and location function 104 determines that an equipment tag list is not included with the electrical single line diagram image data 170, the text extraction and location function 104 can filter the recognized text based on the proximity of text to the location of equipment determined by the equipment type and location data 106 to determine text associated with each equipment tag.

The interactive display assembly function 108 operates to generate interactive single line diagram display data 175 having one or more interactive equipment tags associated with the one or more equipment tags detected in the single line diagram image data and further having visual equipment indications associated with the one or more pieces of equipment detected in the single line diagram image data. In various examples, the interactive display assembly function 108 includes a Web page creator, UI generator, or other web tool that automatically generates interactive single line diagram display data 175 that includes the wiring diagram along with one or more interactive elements such as buttons or links corresponding to equipment tags in the wiring diagram and/or one or more visual indicators of various equipment present in the wiring diagram. In particular, the interactive single line diagram display data 175 can be sent to the client device 125 for display and interaction via a web-based graphical user interface.

Figure 5:
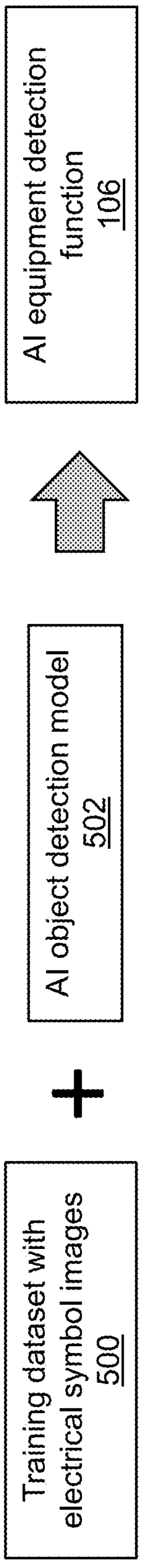
FIG. 5 presents a block/flow diagram representation of an example process for training an AI equipment detection function.

FIG. 5 presents a block/flow diagram representation of an example process for training an AI equipment detection function. In the example shown, the AI equipment detection function 106 can be implemented via an AI object detection model 502 such as a Yolo—v3 model, other computer vision model, other machine learning and/or other AI, is trained based on a training dataset of electrical symbol images 500. The training dataset of electrical symbol images 500 can be updated when new electrical symbols are added, and/or when errors are found in the AI equipment detection function 106. In this fashion, the updated training data set of electrical symbol images 500 can be used to retrain the AI object detection model 502 in order to improve the AI equipment detection function 106.

Figure 6:
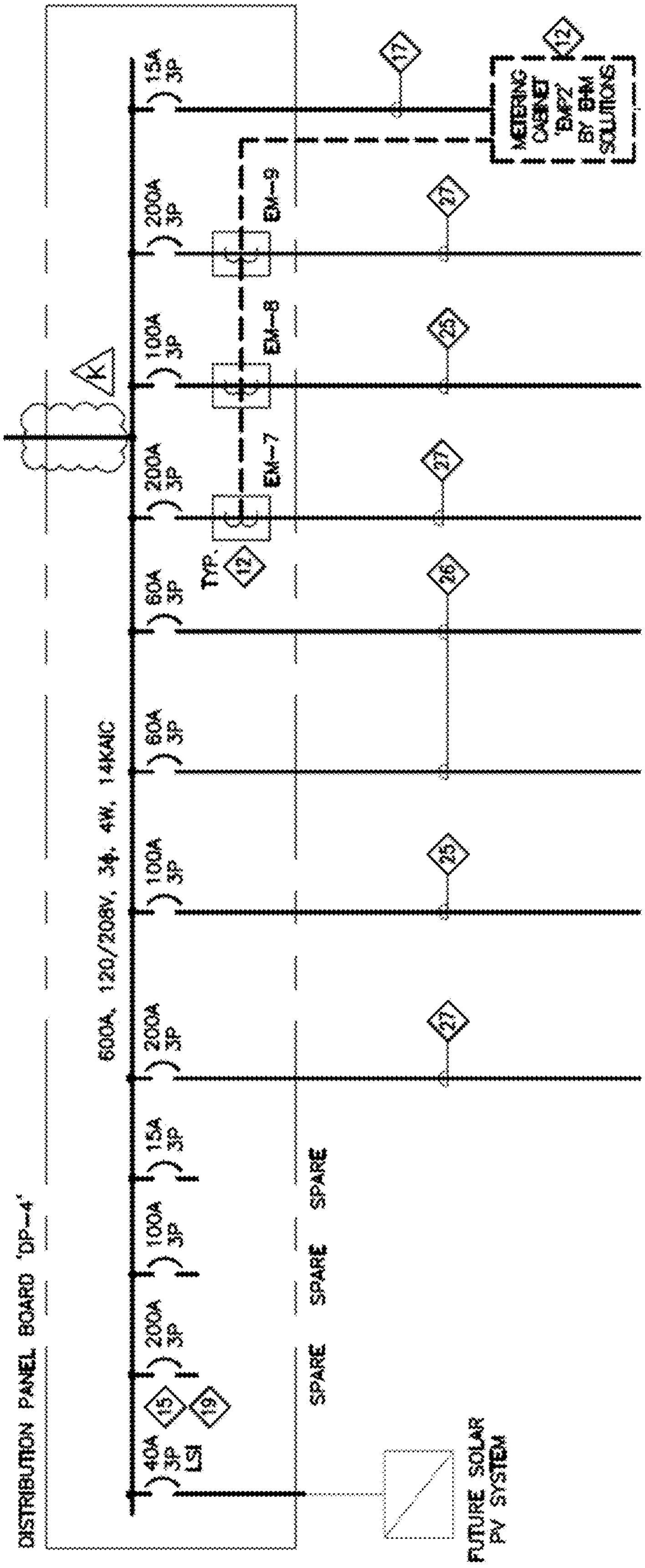
FIG. 6 presents a pictorial representation of an example single line diagram image data.
Figure 7:
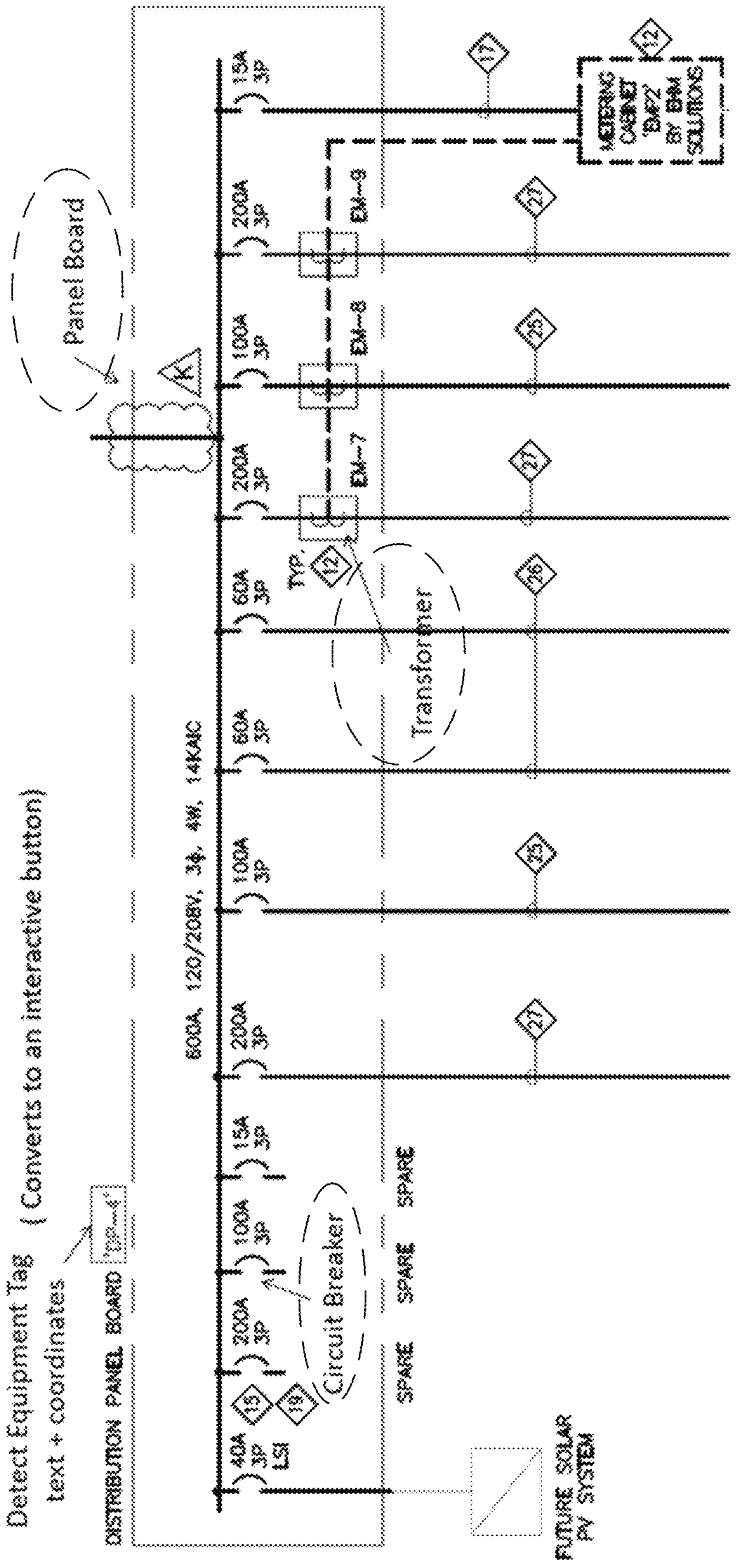
FIG. 7 presents a pictorial representation of an example interactive single line diagram image data.

FIG. 6 presents a pictorial representation of an example single line diagram image data. In particular, SLD input data 170 is shown for an example wiring diagram. FIG. 7 presents a pictorial representation of an example interactive single line diagram image data. In particular, interactive SLD display data 175 is shown corresponding to the SLD input data 170 of FIG. 6 that can be presented as part of a graphical user interface presented via a display of a client device 125.

In the example shown, an equipment tag 'DP-4' has been identified based on its text and coordinates. This equipment tag is converted to an interactive button, presented in conjunction with the graphical user interface, that is overlaid on the wiring diagram in the location of the original equipment tag in the input image. While the interactive button is presented with shading, other highlighting including colored text or colored boundaries could likewise be employed.

When a user clicks on or otherwise selects an equipment TAG, it provides information about that equipment such as:

Location on Site
Other Single Line Drawings in the system where the equipment is present
Approval drawings and manuals related to the equipment
Images of the equipment
etc.

Visual indications of a panel board, one or more circuit breakers, and one or more transformers are surrounded by dashed ellipses to highlight these features. These dashed ellipses can be omitted from the interactive SLD display data 175, however, the visual indications can be presented in colored text and/or other highlighting, for example.

In addition, the line diagram conversion platform 100 can also add analytics in addition to these other features. For example, in electrical construction, the line diagram conversion platform 100 can also provide, facilitate, store and support:

equipment images before shipment (open box and closed box), images after it is received, and apply AI for damage detection.
Track approval drawing versions and chat history between various users or other stakeholders.
Track project details related to the equipment.

Furthermore, once a user clicks on an equipment tag button, they will be able to see a birds-eye view of equipment progress from order to operations. The line diagram conversion platform 100 can operate to perform analytics on the data to provide predictive analytics for schedules, determine and flag potential out of schedule delays, adjust project schedules and estimated completion dates and provide other data associated with project flow.

Figure 8:
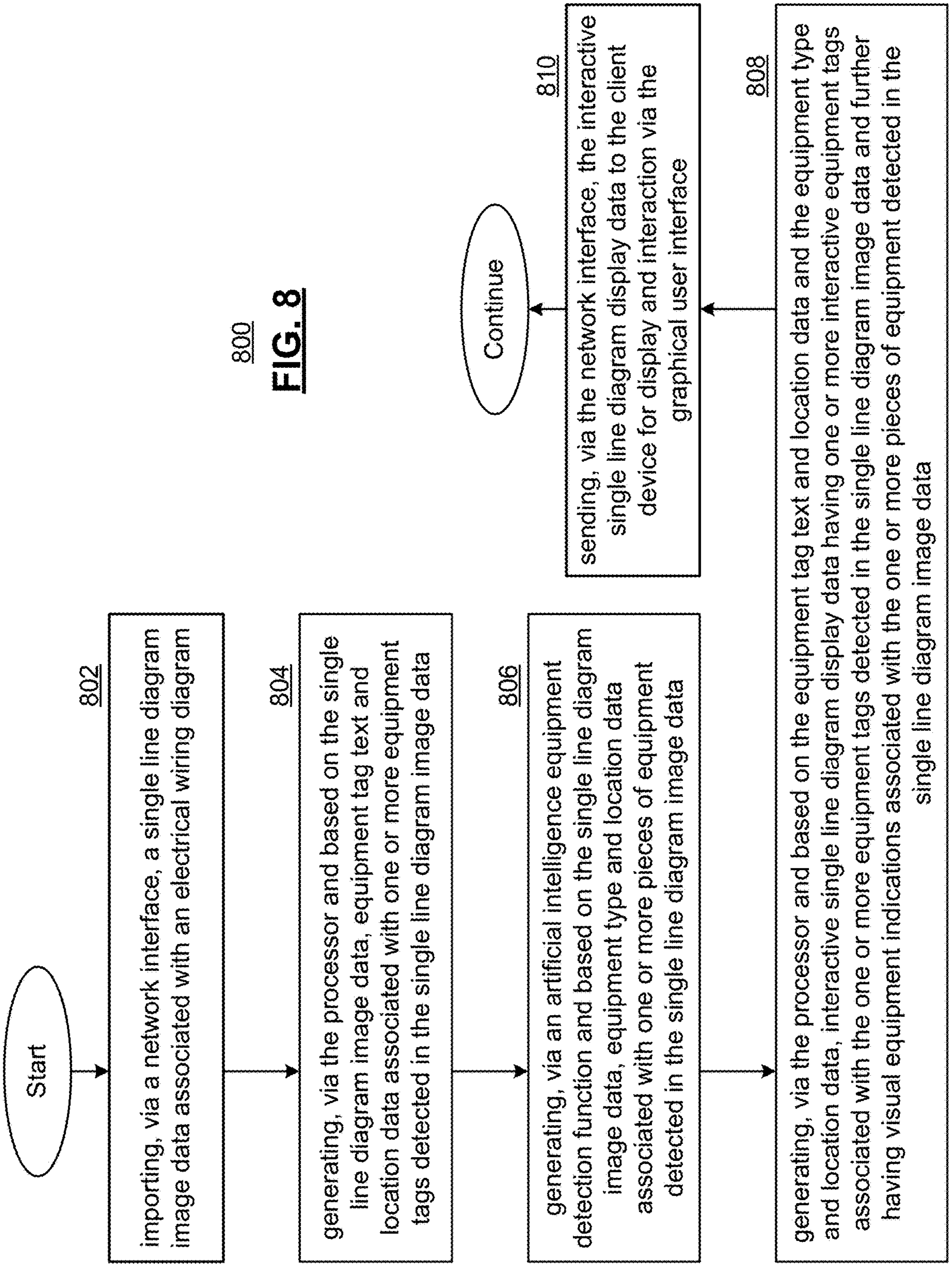
FIG. 8 presents a flowchart representation of an example method.

FIG. 8 presents a flowchart representation of an example method. In particular, a method 800 is presented for use in conjunction with line diagram conversion platform 100 and/or any of the functions and features previously described in conjunction with FIGS. 1-7. Step 802 includes importing, via a network interface, a single line diagram image data associated with an electrical wiring diagram. Step 804 includes generating, via the processor and based on the single line diagram image data, equipment tag text and location data associated with one or more equipment tags detected in the single line diagram image data. Step 806 includes generating, via an artificial intelligence equipment detection function and based on the single line diagram image data, equipment type and location data associated with one or more pieces of equipment detected in the single line diagram image data.

Step 808 includes generating, via the processor and based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data. Step 810 includes sending, via the network interface, the interactive single line diagram display data to the client device for display and interaction via the graphical user interface.

In addition or in alternative to any of the foregoing, the artificial intelligence equipment detection function is implemented via a computer vision model.

In addition or in alternative to any of the foregoing, the computer vision model is trained based on a training dataset of electrical symbol images.

In addition or in alternative to any of the foregoing, the computer vision model is retrained in response to at least one of: when new electrical symbols images are added to the training dataset; or when errors are found in the AI equipment detection function.

In addition or in alternative to any of the foregoing, the equipment tag text and location data indicates the text of the one or more equipment tags and location information indicating a position of each of the one or more equipment tags in the diagram.

In addition or in alternative to any of the foregoing, the equipment tag text and location data is generated via a text extraction and location function that operates via text recognition.

In addition or in alternative to any of the foregoing, the equipment tag text and location data is generated further based on an equipment tag list.

In addition or in alternative to any of the foregoing, the text extraction and location function operates in the absence of an equipment tag list to: generate recognized text; generated filtered text by filtering the recognized text based on a proximity of recognized text to locations of equipment determined by the equipment type and location data; and determine, based on the filtered text, the equipment tag text associated with each of the one or more equipment tags.

In addition or in alternative to any of the foregoing, the one or more interactive equipment tags includes links corresponding to the one or more equipment tags.

In addition or in alternative to any of the foregoing, the graphical user interface is a web-based graphical user interface.

In addition or in alternative to any of the foregoing, the one or more interactive equipment tags includes an interactive button presented in conjunction with the graphical user interface and associated with a corresponding one of the one or more equipment tags.

In addition or in alternative to any of the foregoing, the interactive single line diagram display data includes the electrical wiring diagram and wherein the interactive button is overlaid on the electrical wiring diagram in a location of the corresponding one of the one or more equipment tags.

In addition or in alternative to any of the foregoing, in response to user interaction with the interactive button, the graphical user interface presents equipment information pertaining to the corresponding one of the one or more equipment tags.

In addition or in alternative to any of the foregoing, the equipment information pertaining to the corresponding one of the one or more equipment tags includes one or more of: a site location, information on other single line drawings where the equipment is present; approval drawings; manuals; an image of corresponding equipment; an open box equipment image before shipment of the corresponding equipment; a closed box equipment image before shipment of the corresponding equipment; an equipment image of the corresponding equipment after being received; or project details related to the corresponding equipment.

In addition or in alternative to any of the foregoing, the equipment information pertaining to the corresponding one of the one or more equipment tags includes a review of progress related to corresponding equipment.

In addition or in alternative to any of the foregoing, memory stores project data that includes at least one of: a chat history; project details or the equipment information; and wherein the at least one processor performs analytics on the project data.

In addition or in alternative to any of the foregoing, the analytics include one or more of: a project schedule; a flag of a potential out of schedule delay; an adjustment of the project schedule; an estimated completion date; or project flow data.

Figure 9:
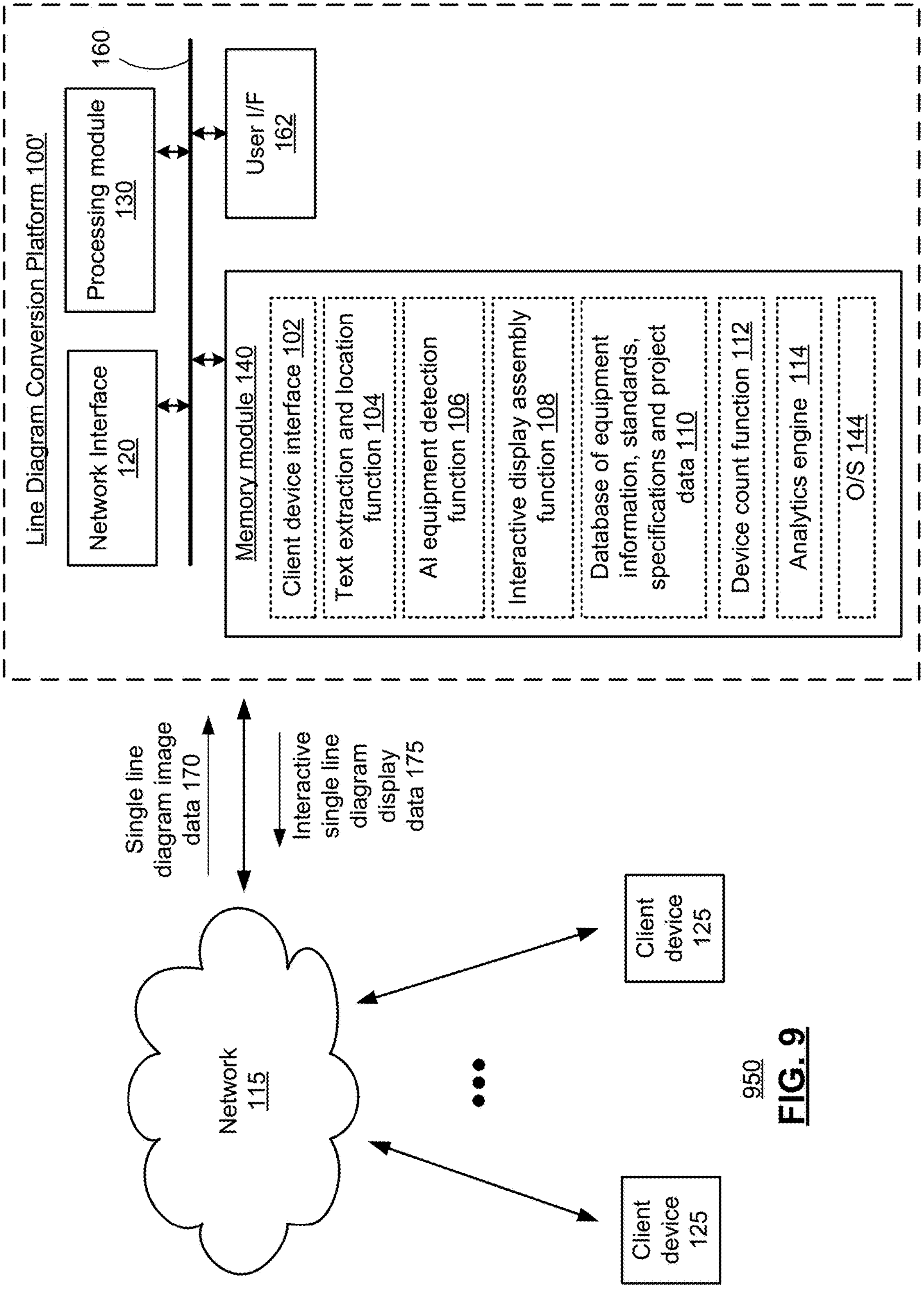
FIG. 9 presents a block diagram representation of an example system.

FIG. 9 presents a block diagram representation of an example system. A system 950 is presented that includes a line diagram conversion platform 100' that communicates with client devices 125 via a network 115. The line diagram conversion platform 100' includes many common elements of line diagram conversion platform 100 that are referred to by common reference numerals. These common elements of the line diagram conversion platform 100' perform similarly to the corresponding elements of the line diagram conversion platform 100 except as noted below. In addition, the line diagram conversion platform 100' includes a database of equipment information, standards (such as electrical standards), specifications (such as electrical specifications) and project data 110, a device count function 112 and an analytics engine 114.

In various examples, the line diagram conversion platform 100' inputs electrical diagrams, layouts and/or other single line drawing image data 170 in order to perform any of all of the following:

1. Apply electrical symbol object detection, based on AI equipment detection function 106 for example, that is based on the electrical standards stored in the database of equipment information, standards, specifications and project data 110.

2. Apply an equipment tag identification and electrical equipment specification extraction, that is based on text extraction and location function 104 for example.
3. Perform, via device count function 112, an automatic device count of components in an equipment, for example, to count the number of breakers and switches in panel boards, switchboards and switch gears that have been recognized or otherwise determined based on the single line drawing image data 170.
4. Generate interactive single line diagram display data for use by a live web application/dashboard of other graphical user interface that displays buttons next to the location of an equipment in the single line drawings.

In various examples, the database of equipment information, standards, specifications and project data 110 and/or the analytics engine 114 can be used, for example, to support various functions of the line diagram conversion platform 100 described on conjunction with FIG. 6. As previously discussed, when a user clicks on or otherwise selects an equipment TAG in via the graphical user interface, the interface provides information about that equipment (e.g. equipment information and/or project data stored in the database of equipment information, standards, specifications and project data 110) such as:

Location on Site
Other Single Line Drawings in the system where the equipment is present
Approval drawings and manuals related to the equipment
Images of the equipment
etc.

In addition, the line diagram conversion platform 100' can also add analytics (generated via analytics engine 114 for example that operates via an AI model or other predictive model) in addition to these other features. For example, in electrical construction, the line diagram conversion platform 100' can also provide, facilitate, store and support equipment information and project data included in the such as:

equipment images before shipment (open box and closed box), images after it is received, and apply AI for damage detection.
Track approval drawing versions and chat history between various users or other stakeholders.
Track project details related to the equipment.

In various examples, once a user clicks on an equipment tag button, they are able to see a birds-eye view of equipment progress from order to operations. The line diagram conversion platform 100' operates to perform analytics on the data to provide predictive analytics (via analytics engine 114) for schedules, determine and flag potential out of schedule delays, adjust project schedules and estimated completion dates and provide other data associated with project flow.

Consider the following examples. The processing system (such as processing module 130) of the line diagram conversion (LDC) platform 100' includes a memory, such as memory module 140, that stores operational instructions and at least one processor, included in processing module 130, that is configured to execute the operational instructions. The operational instructions, when executed, cause the at least one processor to:

facilitate the generation of a graphical user interface to interact with a user of a client device 125;
import, via the network interface 120, single line diagram image data 170 associated with an electrical wiring diagram;
generate, via an artificial intelligence (AI) equipment detection function 106 and based on the single line diagram image data 170, equipment type and location data associated with one or more pieces of equipment detected in the single line diagram image data;
generate equipment tag text and location data associated with one or more equipment tags detected in the single line diagram image data 170;
generate, based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data; and
send, via the network interface 120, the interactive single line diagram display data to the client device 125 for display and interaction via the graphical user interface.

In addition or in the alternative to any of the foregoing, the AI equipment detection function is implemented via a computer vision model.

In addition or in the alternative to any of the foregoing, the computer vision model is trained based on a training dataset including single line diagram image data with annotations.

In addition or in the alternative to any of the foregoing, the computer vision model is retrained in response to at least one of: when images of new electrical symbols are added to the training dataset; or when errors are found in the AI equipment detection function.

In addition or in the alternative to any of the foregoing, the equipment tag text and location data indicates the text of the one or more equipment tags and location information indicating a position of each of the one or more equipment tags in the diagram.

In addition or in the alternative to any of the foregoing, the equipment tag text and location data is generated via a text extraction and location function that operates via text recognition.

In addition or in the alternative to any of the foregoing, the equipment tag text and location data is generated further by: extracting, from the single line diagram image data, equipment images associated with one or more pieces of equipment detected in the single line diagram image data to generate equipment extracted image data; applying the text recognition to the equipment extracted image data to generate text recognition data; processing the text recognition data, based on a database of electrical equipment specifications, to generate the equipment tag text and location data.

In addition or in the alternative to any of the foregoing, the equipment tag text and location data includes: a tag name and tag location; and a tag description and equipment specification with a corresponding location.

In addition or in the alternative to any of the foregoing, the one or more interactive equipment tags includes links corresponding to the one or more equipment tags.

In addition or in the alternative to any of the foregoing, the one or more interactive equipment tags includes an interactive button presented in conjunction with the graphical user interface and associated with a corresponding one of the one or more equipment tags.

In addition or in the alternative to any of the foregoing, the interactive single line diagram display data includes the electrical wiring diagram and wherein the interactive button is overlaid on the electrical wiring diagram in a location of the corresponding one of the one or more equipment tags.

In addition or in the alternative to any of the foregoing, in response to user interaction with the interactive button, the graphical user interface presents equipment information pertaining to the corresponding one of the one or more equipment tags.

In addition or in the alternative to any of the foregoing, the equipment information pertaining to the corresponding one of the one or more equipment tags includes one or more of: a site location, information on other single line drawings where the equipment is present; approval drawings; manuals; an image of corresponding equipment; an open box equipment image before shipment of the corresponding equipment; a closed box equipment image before shipment of the corresponding equipment; an equipment image of the corresponding equipment after being received; or project details related to the corresponding equipment.

In addition or in the alternative to any of the foregoing, the equipment information pertaining to the corresponding one of the one or more equipment tags includes a review of progress related to corresponding equipment.

In addition or in the alternative to any of the foregoing, the memory stores project data that includes at least one of: a chat history; project details or the equipment information; and wherein the at least one processor performs analytics on the project data.

In addition or in the alternative to any of the foregoing, the analytics include one or more of: a project schedule; a flag of a potential out of schedule delay; an adjustment of the project schedule; an estimated completion date; or project flow data.

In addition or in the alternative to any of the foregoing, the operational instructions cause the at least one processor to: generate, based on the equipment type and location data, equipment specifications associated with the one or more equipment tags; and generate an equipment device count; wherein the interactive single line diagram display data is generated further to indicate the equipment specifications and the equipment device count.

Further examples relating to the line diagram conversion platform 100', including several optional functions and features are presented in conjunction with FIGS. 10-13 that follow.

Figure 10:
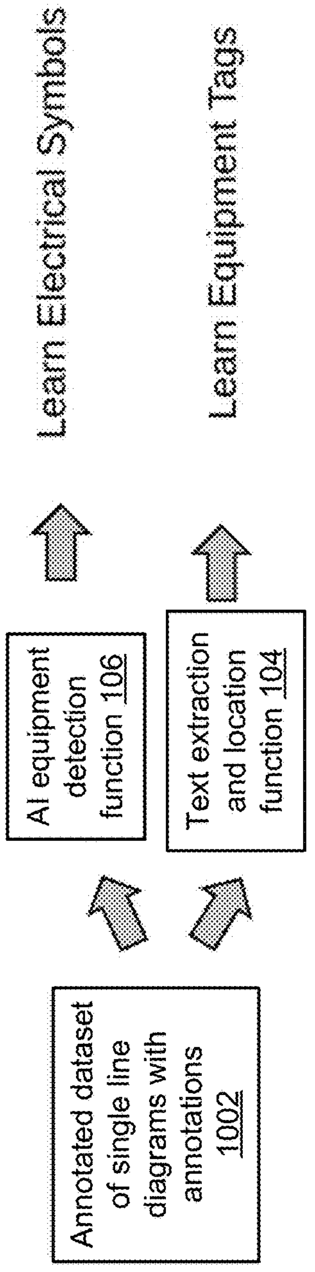
FIG. 10 presents a block/flow diagram representation of an example process for training an AI equipment detection function and a text extraction and location function.

FIG. 10 presents a block/flow diagram representation of an example process for training an AI equipment detection function and a text extraction and location function. A further example relating to the line diagram conversion platform 100' is presented. In the example shown, AI equipment detection function 106 and text extraction and location function 104 are both trained, via machine learning, based on an annotated dataset of single line diagrams with annotations 1002. The annotated dataset of single line diagrams with annotations 1002 includes, for example, a sample set with instances of single line diagram image data 170 of suitable size. The AI equipment detection function 106 is trained to learn electrical symbols and furthermore to generate equipment type and location data 402 in response to single line diagram image data 170. Similarly, the text extraction and location function 104 is trained to learn equipment tags and furthermore to generate equipment tag text and location data 400 in response to single line diagram image data 170.

Figure 11:
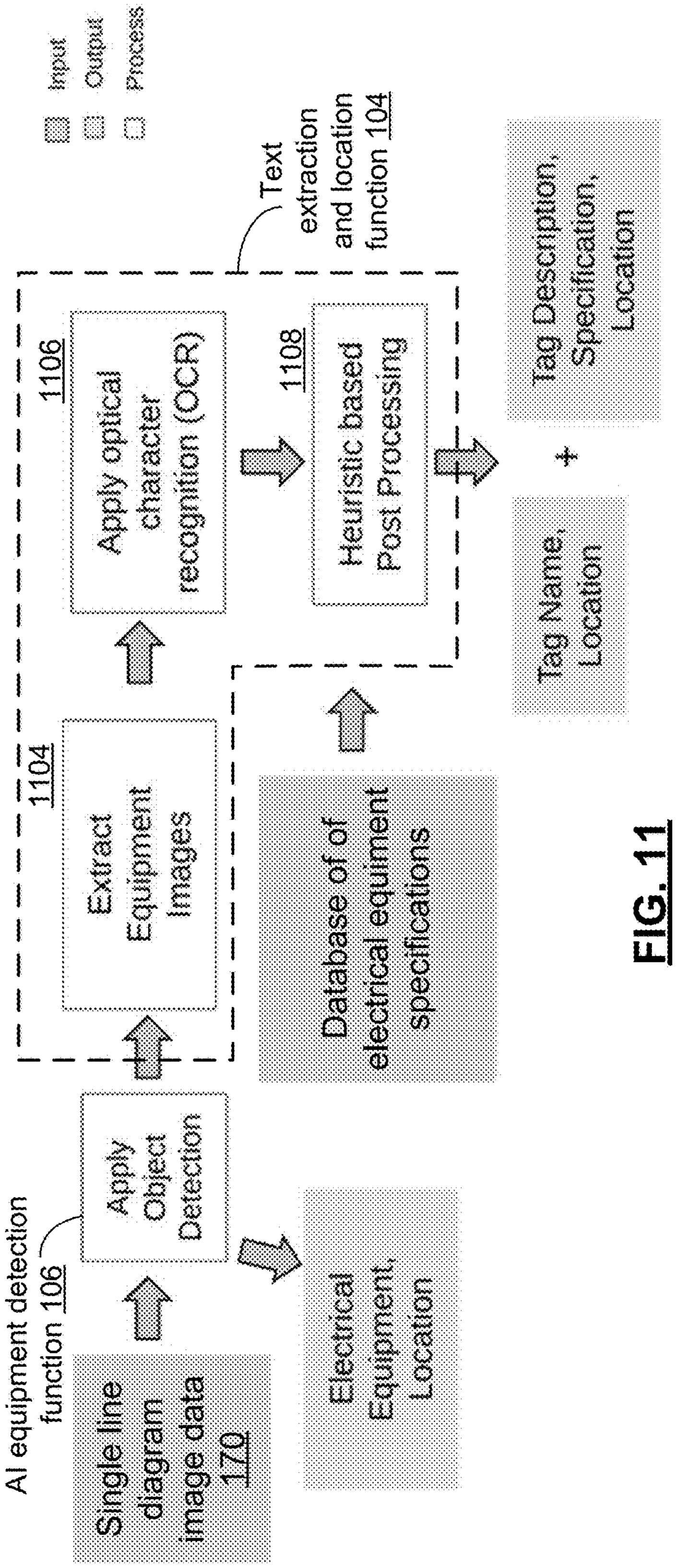
FIG. 11 presents a block/flow diagram representation of an example process for generating interactive single line diagram image data.

FIG. 11 presents a block/flow diagram representation of an example process for generating interactive single line diagram image data. A further example relating to the line diagram conversion platform 100' is presented. In the example shown, the AI equipment detection function 106 applies object detection on the single line diagram image data 170 in order to generate equipment type and location data (e.g., equipment type and location data 402) that indicates one or more pieces of electrical equipment that are present and their corresponding locations in the diagram. The text extraction and location function 104 operates by:

Step 1104, extracting from the single line diagram image data 170, equipment images associated with one or more pieces of equipment detected in the single line diagram image data to generate equipment extracted image data;

Step 1106, applying text recognition (e.g., OCR) to the equipment extracted image data to generate text recognition data;

Step 1108, processing the text recognition data based on a database of electrical equipment specifications, such as specifications included in the database of equipment information, standards, specifications and project data 110. The processing can be performed, for example, using heuristic-based post processing, and generates equipment tag text and location data, such as equipment tag text and location data 404 that for example includes: a tag name and tag location (in the diagram); and a tag description and equipment specification with a corresponding location (in the diagram).

Figure 12:
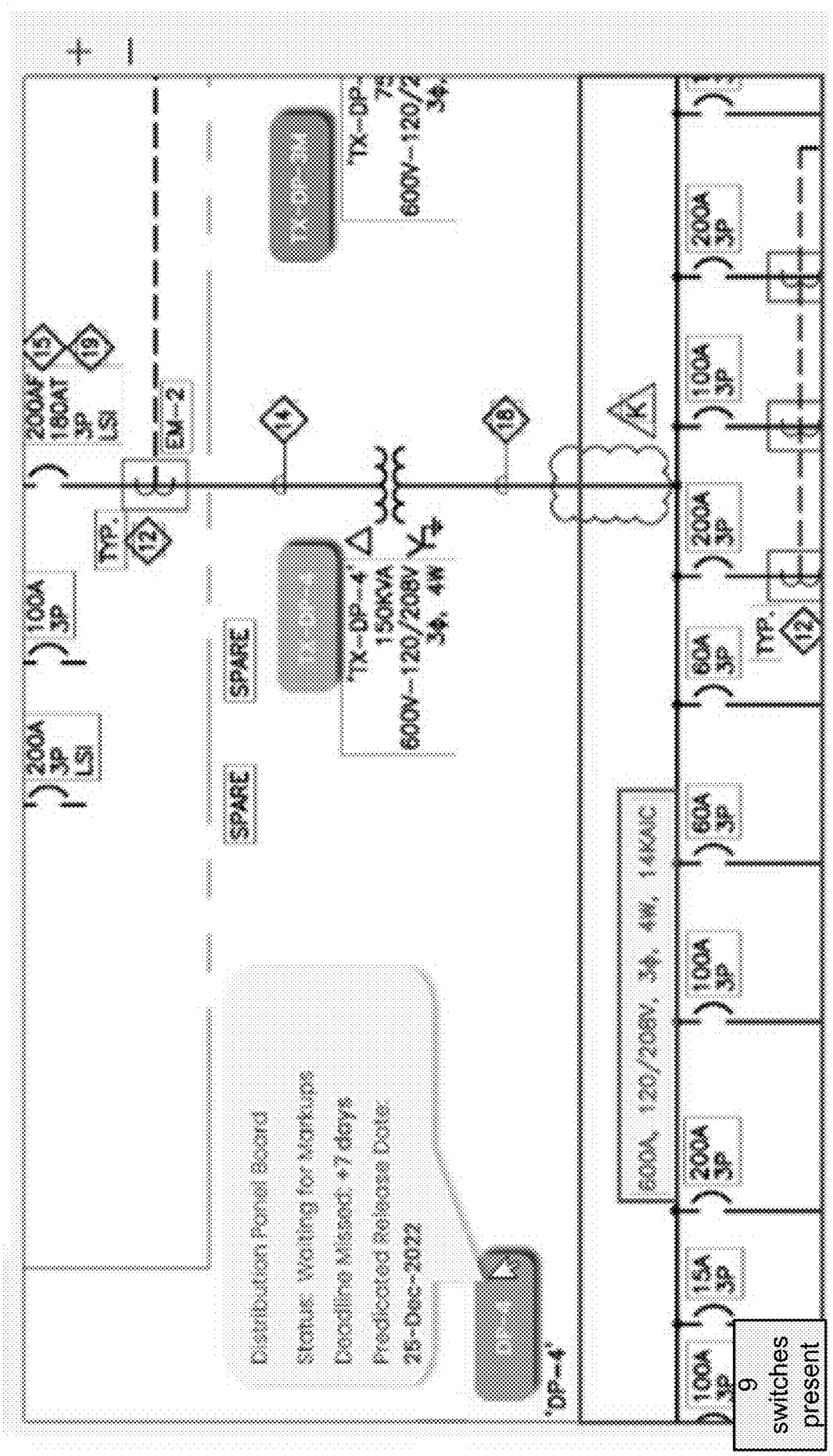
FIG. 12 presents a pictorial representation of an example interactive single line diagram image data.

FIG. 12 presents a pictorial representation of an example interactive single line diagram image data. In particular, a portion of interactive single line diagram image data is shown as generated by the line diagram conversion platform 100', in response to single line diagram image data 170 (a portion of which is presented in FIG. 6). This instance of single line diagram image data 170 includes the following equipment & equipment tags:

A distribution panel board (tagged as DP-4) with specifications: 600 A, 120/208V, 3 Ph, 4 W, 14 KAIC and having 9 switches A transformer (tagged as TX-DP-4) with specifications 150 KVA, 600V-120/208 V, 3phase, 4 W A transformer (tagged as TX-DP-3M) with specifications 75 KVA, 600V-120/208 V, 3phase, 4 W As shown, the line diagram conversion platform 100' has located each item of equipment and the corresponding equipment tags, and the corresponding specifications have been included. Interactive buttons are generated for each of the tags (as shown in red, blue and green). The user has interacted, via client device 125, with the graphical user interface and has selected the button corresponding to equipment tag DP-4. In response, the graphical user interface has presented equipment information and project data corresponding to this particular piece of equipment. Furthermore, the number of switches shown in this portion of the diagram have been counted and an indicator that there are 9 switches present has been overlaid on the diagram.

Figure 13:
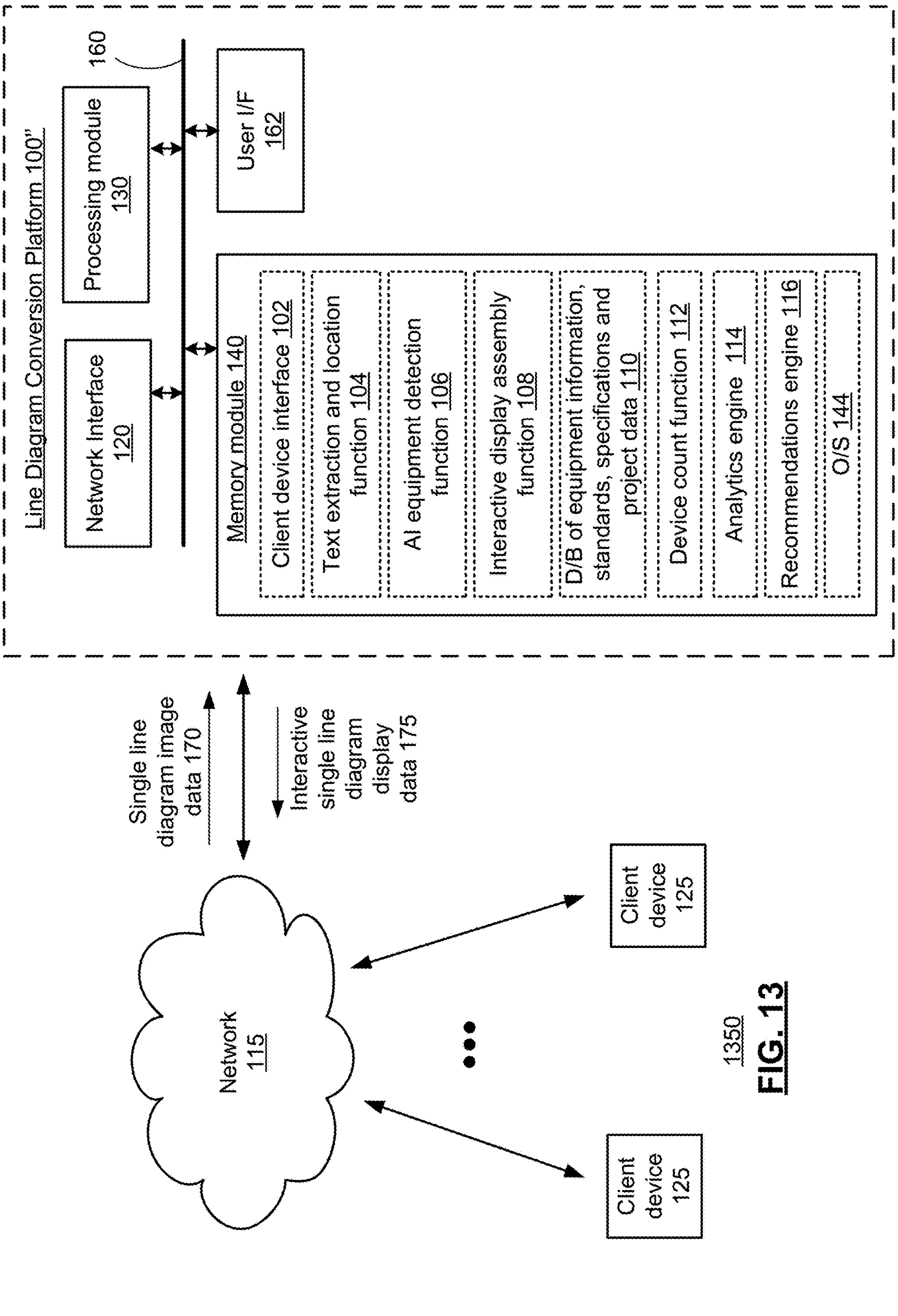
FIG. 13 presents a block diagram representation of an example system.

FIG. 13 presents a block diagram representation of an example system. A system 1350 is presented that includes a line diagram conversion platform 100" that communicates with client devices 125 via a network 115. The line diagram conversion platform 100" includes many common elements of line diagram conversion platforms 100 and/or 100' that are referred to by common reference numerals. These common elements of the line diagram conversion platform 100" perform similarly to the corresponding elements of the line diagram conversion platforms 100 and/or 100' except as noted below.

In addition or in alternative to any of the foregoing, the line diagram conversion platform 100" includes recommendations engine 116 that, for example that operates via an AI model or other predictive model that is trained based on learnings from past projects. The recommendations engine 116 can coupled to a database that includes equipment information, electrical specifications and project data and can be utilized to generate recommendations data. This recommendations data that can be included in the interactive single line diagram image data as part of the graphical user interface displayed via the client device 125.

In addition or in alternative to any of the foregoing, the equipment information, electrical specifications and project data is collected hierarchically.

In addition or in alternative to any of the foregoing, the recommendations engine 116 can be trained via machine learning based on hierarchical data models generated from past projects.

Consider that, in an electrical construction project, some equipment may be custom made and further may require a review process. During the review process, designs changes may be made by several stakeholders involved until the design is frozen and agreed upon. The frozen designs can then be sent for manufacturing. Consider the example where, during the production phase of a current project, the recommendation engine 114 ingests data in the form of equipment information, electrical specifications and/or project data collected during review phase of the project and generates recommendations data that can be presented to the user for plausible changes to the designs. The recommendations data can include, for example, recommendations for equipment designs and/or other project modifications that can help the user with reducing manufacturing complexity, time of manufacturing and cost.

Figure 14:
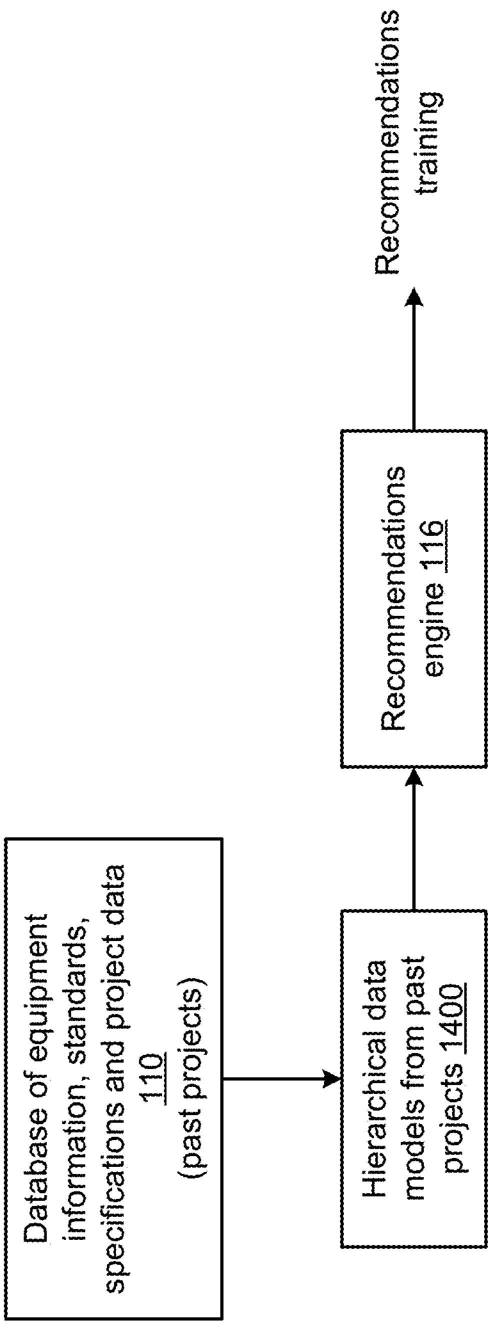
FIG. 14 presents a block/flow diagram representation of an example process.

FIG. 14 presents a block/flow diagram representation of an example process. In particular, an example process is presented for training the recommendations engine 116. In various examples, the database of equipment information, standards, specifications and project data includes equipment information, electrical specifications, project data and/or other data collected from past projects. This data in the form of electrical documentation and historical project data for each project can be used to generate a hierarchical model. The hierarchical models from past projects 1400 can then be fed to the recommendations engine 116 for training, via machine learning for example.

In various examples, the equipment information, electrical specifications, project data can include:

1. Project Drawings (Electrical Single Line diagram, Site Drawings etc.).
2. Tracking Dates of the Equipment in every stage of the equipment lifecycle. For example, an Equipment lifecycle contains Planned, Scheduled and Actual dates for—Equipment order, Review Process, Release for Manufacturer, Testing, shipment, installation and commissioning, handover.
3. Data Uploaded on the platform by the user such as Equipment Names, Description, Unique Tag Name, and Electrical Specification.
4. User Feedback on Changes suggested during the Review Process. Each change is marked by the user on three parameters—cost, complexity, and expected time for the change.

In various examples, project documentation is assembled via the graphical user interface and all the relevant information about equipment, its components and inter-dependencies with other equipment is extracted. The project documentation can be collected through a combination of several techniques to scan and/or otherwise capture project documentation, manuals, schematics, single line diagrams and site plans. The information collection can be based on hierarchical processing in order to construct the hierarchical models 1400. Consider that a project site has multiple items of equipment that are inter-connected. Furthermore, each item of equipment can further have several components associated therewith.

At the highest level, relevant information can be extracted along with a Directed Acyclic Graph (DAG) or other hierarchical structure that indicates the dependency of equipment with each other. Each node of the DAG can correspond to an equipment/component with several features. The equipment connections can be identified based on electrical current flow determined from the corresponding line diagram. Connected equipment ratings can be used to recommend optimized designs.

Consider further examples where the line diagram conversion platform 100" dynamically tracks several dates throughout the lifecycle of an electrical equipment. For example, equipment lifecycle can be tracked that includes planned, scheduled and actual dates for: equipment order, review process, release to manufacturer, testing, shipment, installation, commissioning and/or handover. Project data can be regularly updated with these dates to understand the timeline of several electrical equipment stages. Project data can further include results of a review process, where an end-user or a consultant provides feedback to the initial electrical designs until the design is agreed upon and frozen for everyone. This feedback can be collected as documents, chat, handwritten notes, PDF annotations of in other data forms.

As discussed above, any of foregoing can be used to generate hierarchical data models and/or other data from past projects that are used to train the recommendations engine 116.

Figure 15:
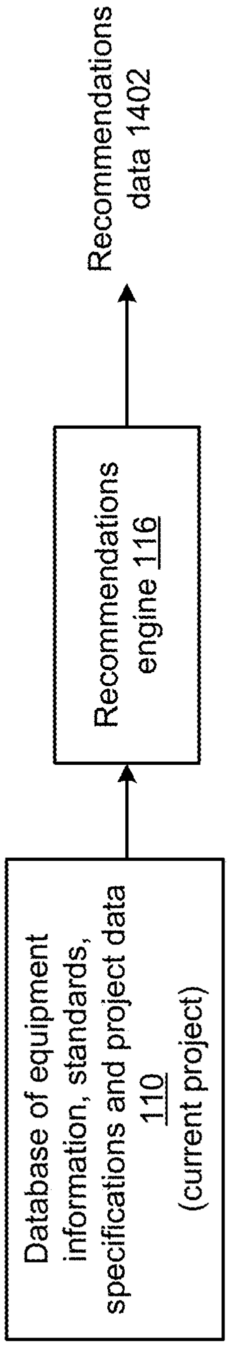
FIG. 15 presents a block/flow diagram representation of an example process.

FIG. 15 presents a block/flow diagram representation of an example process. In particular, an example process for generating recommendations data 1402 from the recommendations engine 116 is presented. In this case, the recommendations engine 116 has previously been trained. As previously discussed, the recommendations engine 116 can coupled to a database, such as database of equipment, information, standards, specifications and project data 110 that includes equipment information, electrical specifications and project data pertaining to a current project that can be utilized to generate the recommendations data. This recommendations data that can be included in the interactive single line diagram image data as part of the graphical user interface displayed via the client device 125.

In addition or in alternative to any of the foregoing, the equipment information, electrical specifications and project data is collected hierarchically.

In addition or in alternative to any of the foregoing, any of data collection methodologies and/or data that has been collected as discussed in FIG. 14 in conjunction with past projects—can likewise be used to collect and assemble data for a current project for analysis via the recommendations engine 116 to generate recommendations data 1402 for a current project.

Figure 16:
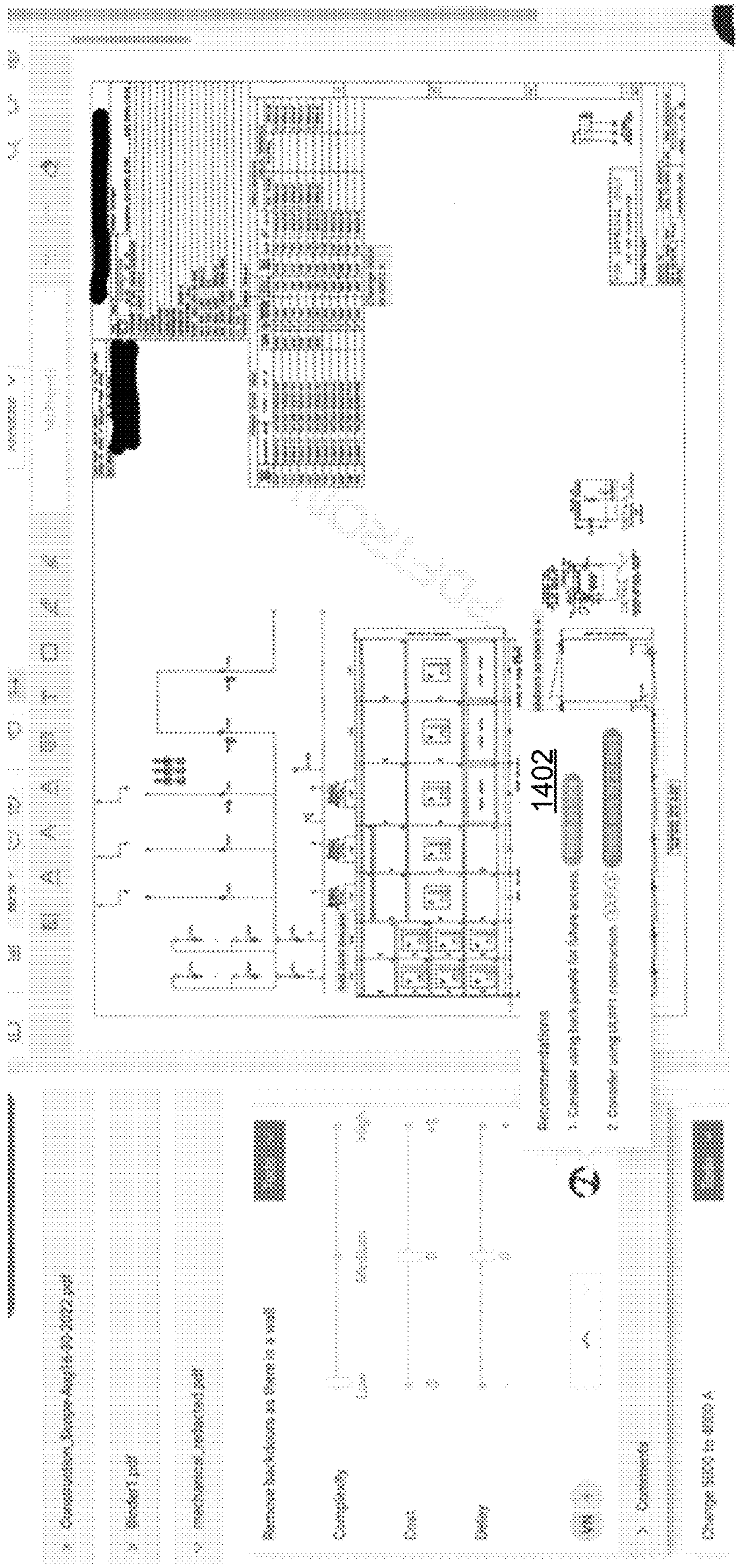
FIG. 16 presents a pictorial representation of an example interactive single line diagram image data.

FIG. 16 presents a pictorial representation of an example of interactive single line diagram image data. In this example, the line diagram conversion platform 100" has facilitated the generation of a graphical user interface and that has further facilitated:

- Extracting notes on the documents and providing as a list of changes as a sidebar on the interface next to a PDF during the review process of an electrical construction. Upon click of these changes, the PDF goes to the page number where the changes were made.
- Capturing feedback from the users on the impact of every change on the project to include as project data. This can include extraction of user tasks/comments from a PDF during the review process, indicating task "todo"s and/or collecting user feedback on extracted tasks, based on complexity, cost and delay of the project.

Tracking whether every change has been taken care of and/or the impact of each change.

Displaying recommendations data 1402, that for example, provides recommendations during the review process of electrical construction to the user on plausible changes in the designs which an end-user or a consultant might have missed. These recommendations can be presented on a sidebar next to an opened PDF. When a user clicks on any task it opens the PDF at the exact page number where the task is assigned in the electrical design during the review process.

While a particular example of a screen display is presented, it should be moted that many alternatives are likewise possible within the broader scope of the present disclosure.

Figure 17:
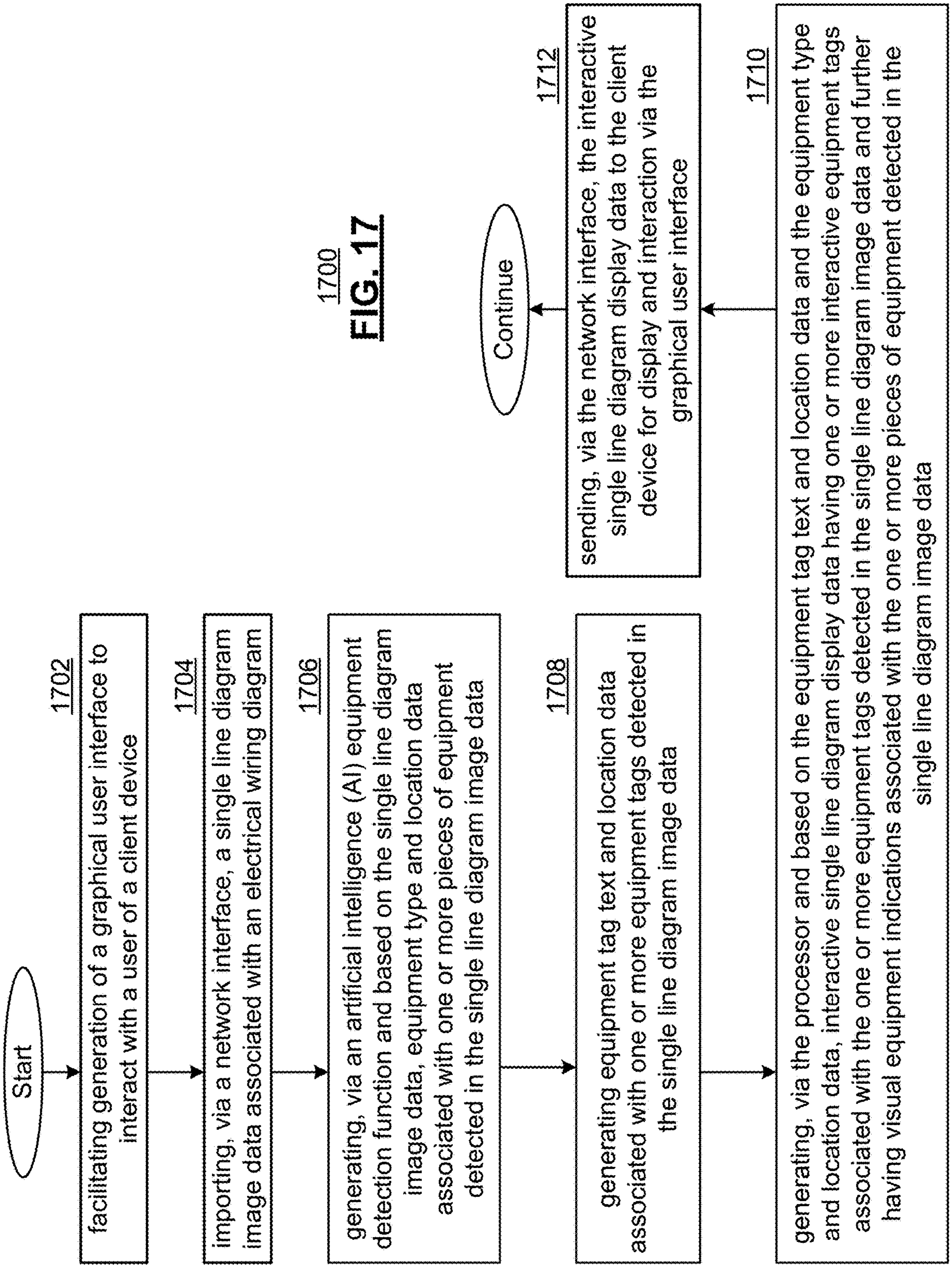
FIG. 17 presents a flowchart representation of an example method.

FIG. 17 presents a flowchart representation of an example method. In particular, a method 1700 is presented for use in conjunction with line diagram conversion platform 100, 100' and/or 100" and/or any of the functions and features previously described in conjunction with FIGS. 1-16. Step 1702 includes facilitating generation of a graphical user interface to interact with a user of a client device. Step 1704 includes importing, via a network interface, single line diagram image data associated with an electrical wiring diagram. Step 1706 includes generating, via an artificial intelligence (AI) equipment detection function and based on the single line diagram image data, equipment type and location data associated with one or more pieces of equipment detected in the single line diagram image data. Step 1708 includes generating equipment tag text and location data associated with one or more equipment tags detected in the single line diagram image data.

Step 1710 includes generating, via the processor and based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data. Step 1712 includes sending, via the network interface, the interactive single line diagram display data to the client device for display and interaction via the graphical user interface.

In addition or in the alternative to any of the foregoing, the AI equipment detection function is implemented via a computer vision model.

In addition or in the alternative to any of the foregoing, the computer vision model is trained based on a training dataset including single line diagram image data with annotations.

In addition or in the alternative to any of the foregoing, the computer vision model is retrained in response to at least one of: when images of new electrical symbols are added to the training dataset; or when errors are found in the AI equipment detection function.

In addition or in the alternative to any of the foregoing, the equipment tag text and location data indicates the text of the one or more equipment tags and location information indicating a position of each of the one or more equipment tags in the diagram.

In addition or in the alternative to any of the foregoing, the equipment tag text and location data is generated via a text extraction and location function that operates via text recognition.

In addition or in the alternative to any of the foregoing, the equipment tag text and location data is generated further by: extracting, from the single line diagram image data, equipment images associated with one or more pieces of equipment detected in the single line diagram image data to generate equipment extracted image data; applying the text recognition to the equipment extracted image data to generate text recognition data; processing the text recognition data, based on a database of electrical equipment specifications, to generate the equipment tag text and location data.

In addition or in the alternative to any of the foregoing, the equipment tag text and location data includes: a tag name and tag location; and a tag description and equipment specification with a corresponding location.

In addition or in the alternative to any of the foregoing, the one or more interactive equipment tags includes links corresponding to the one or more equipment tags.

In addition or in the alternative to any of the foregoing, the one or more interactive equipment tags includes an interactive button presented in conjunction with the graphical user interface and associated with a corresponding one of the one or more equipment tags.

In addition or in the alternative to any of the foregoing, the interactive single line diagram display data includes the electrical wiring diagram and wherein the interactive button is overlaid on the electrical wiring diagram in a location of the corresponding one of the one or more equipment tags.

In addition or in the alternative to any of the foregoing, in response to user interaction with the interactive button, the graphical user interface presents equipment information pertaining to the corresponding one of the one or more equipment tags.

In addition or in the alternative to any of the foregoing, the equipment information pertaining to the corresponding one of the one or more equipment tags includes one or more of: a site location, information on other single line drawings where the equipment is present; approval drawings; manuals; an image of corresponding equipment; an open box equipment image before shipment of the corresponding equipment; a closed box equipment image before shipment of the corresponding equipment; an equipment image of the corresponding equipment after being received; or project details related to the corresponding equipment.

In addition or in the alternative to any of the foregoing, the equipment information pertaining to the corresponding one of the one or more equipment tags includes a review of progress related to corresponding equipment.

In addition or in the alternative to any of the foregoing, the memory stores project data that includes at least one of: a chat history; project details or the equipment information; and wherein the at least one processor performs analytics on the project data.

In addition or in the alternative to any of the foregoing, the analytics include one or more of: a project schedule; a flag of a potential out of schedule delay; an adjustment of the project schedule; an estimated completion date; or project flow data.

In addition or in the alternative to any of the foregoing, the operational instructions cause the at least one processor to: generate, based on the equipment type and location data, equipment specifications associated with the one or more equipment tags; and generate an equipment device count; wherein the interactive single line diagram display data is generated further to indicate the equipment specifications and the equipment device count.

In addition or in the alternative to any of the foregoing, the method further includes: generating recommendations data via a recommendations engine that is coupled to a database that includes equipment information, electrical specifications and project data, wherein the interactive single line diagram display data is generated further to indicate the recommendations data.

In addition or in the alternative to any of the foregoing, the equipment information, electrical specifications and project data is collected hierarchically and wherein the recommendations engine is trained via machine learning based on hierarchical data models generated from past projects.

As used herein the term "tool" or "function" corresponds to a utility, application and/or other software routine that performs one or more specific functions in conjunction with a computer.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more examples have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a “start” and/or “continue” indication. The “start” and “continue” indications reflect that the steps presented can optionally be incorporated in or otherwise used in conjunction with one or more other routines. In addition, a flow diagram may include an “end” and/or “continue” indication. The “end” and/or “continue” indications reflect that the steps presented can end as described and shown or optionally be incorporated in or otherwise used in conjunction with one or more other routines. In this context, “start” indicates the beginning of the first step presented and may be preceded by other activities not specifically shown. Further, the “continue” indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more examples are used herein to illustrate one or more aspects, one or more features, one or more concepts, and/or one or more examples. A physical example of an apparatus, an article of manufacture, a machine, and/or of a process may include one or more of the aspects, features, concepts, examples, etc. described with reference to one or more of the examples discussed herein. Further, from figure to figure, the examples may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term “module” is used in the description of one or more of the examples. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

One or more functions associated with the methods and/or processes described herein can be implemented via a processing module that operates via the non-human “artificial” intelligence (AI) of a machine. Examples of such AI include machines that operate via anomaly detection techniques, decision trees, association rules, expert systems and other knowledge-based systems, computer vision models, artificial neural networks, convolutional neural networks, support vector machines (SVMs), Bayesian networks, genetic algorithms, feature learning, sparse dictionary learning, preference learning, deep learning and other machine learning techniques that are trained using training data via unsupervised, semi-supervised, supervised and/or reinforcement learning, and/or other AI. The human mind is not equipped to perform such AI techniques, not only due to the complexity of these techniques, but also due to the fact that artificial intelligence, by its very definition—requires “artificial” intelligence—i.e. machine/non-human intelligence.

One or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

One or more functions associated with the methods and/or processes described herein can be implemented in a system that is operable to electronically store digital data in a memory device. Such storage cannot practically be performed by the human mind because the human mind is not equipped to electronically store digital data.

One or more functions associated with the methods and/or processes described herein may operate to cause an action by a processing module directly in response to a triggering event—without any intervening human interaction between the triggering event and the action. Any such actions may be identified as being performed "automatically", "automatically based on" and/or "automatically in response to" such a triggering event. Furthermore, any such actions identified in such a fashion specifically preclude the operation of human activity with respect to these actions—even if the triggering event itself may be causally connected to a human activity of some kind.

While particular combinations of various functions and features of the one or more examples have been expressly described herein, other combinations of these features and functions are likewise possible. The present disclosure is not limited by the particular examples disclosed herein and expressly incorporates these other combinations.

What is claimed is:

1. A line diagram conversion (LDC) platform comprising:

a network interface configured to communicate via a network; and a processing system that includes a memory that stores operational instructions and at least one processor configured to execute the operational instructions, wherein the operational instructions cause the at least one processor to:

facilitate generation of a graphical user interface to interact with a user of a client device;

import, via the network interface, single line diagram image data associated with an electrical wiring diagram;

generate, via an artificial intelligence (AI) equipment detection function and based on the single line diagram image data, equipment type and location data associated with one or more pieces of equipment detected in the single line diagram image data;

generate equipment tag text and location data associated with one or more equipment tags detected in the single line diagram image data;

generate, based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data; and send, via the network interface, the interactive single line diagram display data to the client device for display and interaction via the graphical user interface wherein the one or more interactive equipment tags includes an interactive button presented in conjunction with the graphical user interface and associated with a corresponding one of the one or more equipment tags; and wherein the interactive single line diagram display data includes the electrical wiring diagram and wherein the interactive button is overlaid on the electrical wiring diagram in a location of the corresponding one of the one or more equipment tags.

2. The LDC platform of claim 1, wherein the AI equipment detection function is implemented via a computer vision model.

3. The LDC platform of claim 2, wherein the computer vision model is trained based on a training dataset including single line diagram image data with annotations.

4. The LDC platform of claim 3, wherein the computer vision model is retrained in response to at least one of: when images of new electrical symbols are added to the training dataset; or when errors are found in the AI equipment detection function.

5. The LDC platform of claim 1, wherein the equipment tag text and location data indicates the text of the one or more equipment tags and location information indicating a position of each of the one or more equipment tags in the diagram.

6. The LDC platform of claim 1, wherein the equipment tag text and location data is generated via a text extraction and location function that operates via text recognition.

7. The LDC platform of claim 6, wherein the equipment tag text and location data is generated further by:

extracting, from the single line diagram image data, equipment images associated with one or more pieces of equipment detected in the single line diagram image data to generate equipment extracted image data;

applying the text recognition to the equipment extracted image data to generate text recognition data;

processing the text recognition data, based on a database of electrical equipment specifications, to generate the equipment tag text and location data.

8. The LDC platform of claim 4, wherein the equipment tag text and location data includes: a tag name and tag location; and a tag description and equipment specification with a corresponding location.

9. The LDC platform of claim 1, wherein the one or more interactive equipment tags includes links corresponding to the one or more equipment tags.

10. The LDC platform of claim 1, wherein, in response to user interaction with the interactive button, the graphical user interface presents equipment information pertaining to the corresponding one of the one or more equipment tags.

11. The LDC platform of claim 10, wherein the equipment information pertaining to the corresponding one of the one or more equipment tags includes one or more of: a site location, information on other single line drawings where the equipment is present; approval drawings; manuals; an image of corresponding equipment; an open box equipment image before shipment of the corresponding equipment; a closed box equipment image before shipment of the corresponding equipment; an equipment image of the corresponding equipment after being received; or project details related to the corresponding equipment.

12. The LDC platform of claim 10, wherein the equipment information pertaining to the corresponding one of the one or more equipment tags includes a review of progress related to corresponding equipment.

13. The LDC platform of claim 10, wherein the memory stores project data that includes at least one of: a chat history; project details or the equipment information; and wherein the at least one processor performs analytics on the project data.

14. The LDC platform of claim 13, wherein the analytics include one or more of: a project schedule; a flag of a potential out of schedule delay; an adjustment of the project schedule; an estimated completion date; or project flow data.

15. The LDC platform of claim 1, wherein the operational instructions cause the at least one processor to:

generate, based on the equipment type and location data, equipment specifications associated with the one or more equipment tags; and generate an equipment device count;

wherein the interactive single line diagram display data is generated further to indicate the equipment specifications and the equipment device count.

16. The LDC platform of claim 1, wherein the operational instructions cause the at least one processor to:

generate recommendations data via a recommendations engine that is coupled to a database that includes equipment information, electrical specifications and project data;

wherein the interactive single line diagram display data is generated further to indicate the recommendations data.

17. The LDC platform of claim 16, wherein the equipment information, electrical specifications and project data is collected hierarchically and wherein the recommendations engine is trained via machine learning based on hierarchical data models generated from past projects.

18. A method for use with a line drawing conversion platform that includes a processor and a memory, the method comprising:

facilitating generation of a graphical user interface to interact with a user of a client device;

importing, via a network interface, single line diagram image data associated with an electrical wiring diagram;

generating, via an artificial intelligence (AI) equipment detection function and based on the single line diagram image data, equipment type and location data associated with one or more pieces of equipment detected in the single line diagram image data;

generating equipment tag text and location data associated with one or more equipment tags detected in the single line diagram image data;

generating, via the processor and based on the equipment tag text and location data and the equipment type and location data, interactive single line diagram display data having one or more interactive equipment tags associated with the one or more equipment tags detected in the single line diagram image data and further having visual equipment indications associated with the one or more pieces of equipment detected in the single line diagram image data; and sending, via the network interface, the interactive single line diagram display data to the client device for display and interaction via the graphical user interface wherein the one or more interactive equipment tags includes an interactive button presented in conjunction with the graphical user interface and associated with a corresponding one of the one or more equipment tags; and wherein the interactive single line diagram display data includes the electrical wiring diagram and wherein the interactive button is overlaid on the electrical wiring diagram in a location of the corresponding one of the one or more equipment tags.

* * * * *